United States Patent
Kim et al.

(10) Patent No.: US 12,249,497 B2
(45) Date of Patent: Mar. 11, 2025

(54) SPUTTERING APPARATUS

(71) Applicant: Samsung Display Co., LTD., Yongin-si (KR)

(72) Inventors: Hyun-Woo Kim, Cheonan-si (KR); Sangmok Nam, Seongnam-si (KR); Jaeho Byeon, Asan-si (KR); Jongho Hyun, Cheonan-si (KR); Nam-Jin Hyung, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/629,457

(22) Filed: Apr. 8, 2024

(65) Prior Publication Data
US 2024/0258088 A1    Aug. 1, 2024

Related U.S. Application Data

(63) Continuation of application No. 17/717,521, filed on Apr. 11, 2022, now Pat. No. 11,978,615.

(30) Foreign Application Priority Data

Jul. 30, 2021    (KR) .......................... 10-2021-0100464

(51) Int. Cl.
*H01J 37/34*    (2006.01)
*C23C 14/35*    (2006.01)

(52) U.S. Cl.
CPC ............ *H01J 37/347* (2013.01); *C23C 14/35* (2013.01); *H01J 37/3435* (2013.01); *H01J 37/3455* (2013.01); *H01J 2237/332* (2013.01)

(58) Field of Classification Search
CPC .. H01J 37/347; H01J 37/3435; H01J 37/3455; H01J 37/3441; H01J 37/3447; H01J 37/3405; C23C 14/35; C23C 14/3407
USPC ...................................................... 204/298.11
See application file for complete search history.

(56) References Cited

U.S. PATENT DOCUMENTS 8,685,214 B1    4/2014    Moh et al.

FOREIGN PATENT DOCUMENTS

| CN | 112239854 A | 1/2021 |
|---|---|---|
| JP | H08134640 A | 5/1996 |
| JP | H0920979 A | 1/1997 |
| KR | 1019980034222 A | 8/1998 |
| KR | 1020080055381 A | 6/2008 |
| KR | 1020110129279 A | 7/2012 |
| KR | 1020120015188 A | 6/2017 |
| KR | 1020190005628 A | 1/2020 |

*Primary Examiner* — Rodney G McDonald
(74) *Attorney, Agent, or Firm* — CANTOR COLBURN LLP

(57) ABSTRACT

A sputtering apparatus includes a back plate supporting a sputtering target, a magnet module disposed under the back plate and including a magnet unit reciprocating in a first direction, a first shielding member attached on a portion of the magnet unit, moving together with the magnet unit, and covering at least a portion of the magnet unit, a protective sheet disposed between the back plate and the magnet module, and a second shielding member disposed between the back plate and the magnet module, and having a fixed position.

15 Claims, 8 Drawing Sheets

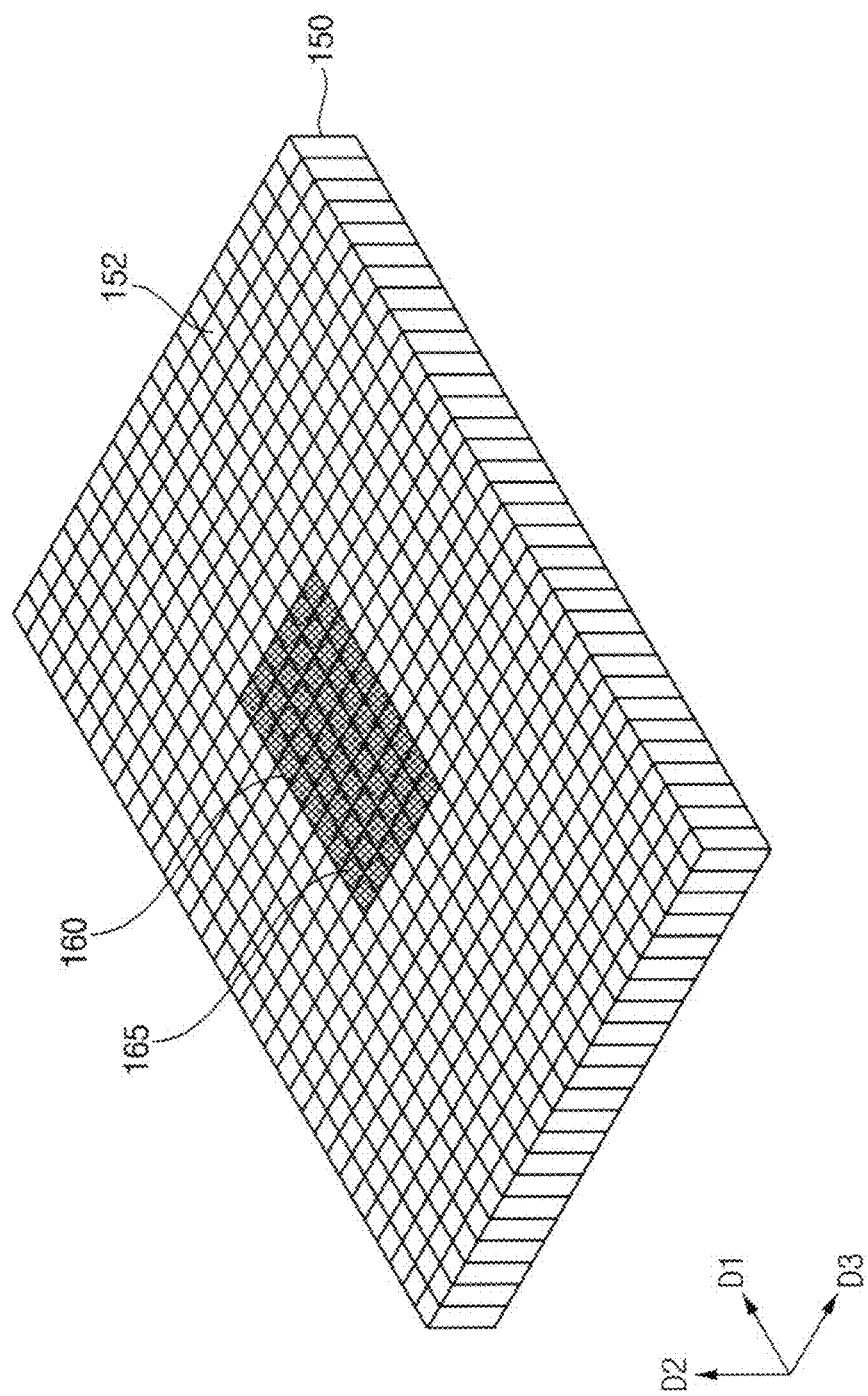

SPUTTERING APPARATUS

This application is a continuation of U.S. patent application Ser. No. 17/717,521, filed on Apr. 11, 2022, which claims priority to Korean Patent Application No. 10-2021-0100464, filed on Jul. 30, 2021, and all the benefits accruing therefrom under 35 U.S.C. § 119, the content of which in its entirety is herein incorporated by reference.

BACKGROUND

1. Field

Embodiments provide generally to a sputtering apparatus. More particularly, embodiments relate to a sputtering apparatus for depositing a thin film.

2. Description of the Related Art

Sputtering is a main method of depositing a metal thin film on a substrate constituting a flat panel display device such as a liquid crystal display device ("LCD"), an organic light-emitting display device ("OLED"), or the like.

Recently, in the sputtering method, a magnetron-sputtering method using a magnetic field is used to increase a deposition rate. Specifically, the magnetic field generated by a magnet module disposed adjacent to a sputtering target captures electrons to generate high-density plasma, thereby increasing the deposition rate.

SUMMARY

As a plasma is concentrated due to an uneven distribution of magnetic field, an erosion of a sputtering target may be non-uniform.

Embodiments provide a sputtering apparatus capable of improving the erosion non-uniformity of a sputtering target.

A sputtering apparatus in an embodiment may include a back plate supporting a sputtering target, a magnet module disposed under the back plate and including a magnet unit reciprocating in a first direction, a first shielding member attached on a portion of the magnet unit, moving together with the magnet unit, and covering at least a portion of the magnet unit, a protective sheet disposed between the back plate and the magnet module, and a second shielding member disposed between the back plate and the magnet module, and having a fixed position.

In an embodiment, the magnet unit may reciprocate between a first point and a second point of the sputtering target. A center point of the second shielding member may coincide with a center line between the first point and the second point.

In an embodiment, a trench may be defined in the protective sheet. The second shielding member may be inserted into the trench.

In an embodiment, the second shielding member may include a metal.

In an embodiment, the second shielding member may include at least one of stainless steel, permalloy, and pure iron.

In an embodiment, the first shielding member may include stainless steel.

In an embodiment, the protective sheet may include polytetrafluoroethylene.

In an embodiment, a thickness of the second shielding member may be smaller than a thickness of the protective sheet in a thickness direction orthogonal to a main plane extension direction of the second shielding member.

In an embodiment, the second shielding member may have a polygonal shape in a plan view.

In an embodiment, the polygonal shape may be at least one of a rhombus shape, a circle shape, an ellipse shape, and an inverted triangle shape.

In an embodiment, the second shielding member may include a first shielding pattern overlapping a first end of the sputtering target, and a second shielding pattern spaced apart from the first shielding pattern in a second direction intersecting the first direction and overlapping a second end of the sputtering target.

In an embodiment, a number of the first shielding pattern may be equal to a number of the second shielding pattern.

In an embodiment, the number of the first shielding pattern or the number of the second shielding pattern may be equal to a number of the magnet unit.

In an embodiment, a first length of the second shielding member in the first direction may be about 0.6 to about 1.2 of a width of the magnet unit in the first direction. A second length of the second shielding member in a second direction intersecting the first direction may be about 0.5 to about 1 of the first length in a plan view.

In an embodiment, the magnet unit may include a first magnet member extending in a linear shape in a plan view and a second magnet member having a shape surrounding the first magnet member in the plan view.

A sputtering apparatus in another embodiment may include a back plate supporting a sputtering target, a magnet module disposed under the back plate and including a magnet unit reciprocating in a first direction, a first shielding member attached on a portion of the magnet unit, moving together with the magnet unit, and covering at least a portion of the magnet unit, a protective sheet which is disposed between the back plate and the magnet module, and in which a plurality of block grooves is defined, and a second shielding member including a plurality of block bodies inserted into at least one of the plurality of block grooves, disposed between the back plate and the magnet module, and having a fixed position.

In an embodiment, the magnet unit may reciprocate between a first point and a second point of the sputtering target. A center point of the second shielding member may coincide with a center line between the first point and the second point.

In an embodiment, the first shielding member may include stainless steel and the second shielding member may include at least one of stainless steel, permalloy, and pure iron.

In an embodiment, the second shielding member may have a polygonal shape in a plan view.

In an embodiment, a first length of the second shielding member in the first direction may be about 0.6 to about 1.2 of a width of the magnet unit in the first direction. A second length of the second shielding member in a second direction orthogonal to the first direction may be about 0.5 to about 1 of the first length in a plan view.

A sputtering apparatus in an embodiment of the invention may include a first shielding member attached on a magnet module, and a second shielding member disposed between a back plate and a magnet module and having a fixed position. Accordingly, an erosion non-uniformity of a sputtering target may be improved. In this case, a lifetime of the sputtering target may be extended.

BRIEF DESCRIPTION OF THE DRAWINGS

Illustrative, non-limiting embodiments will be more clearly understood from the following detailed description in conjunction with the accompanying drawings.

FIG. 8 is a perspective view illustrating another embodiment of a protective sheet and a second shielding member of a sputtering apparatus.

DETAILED DESCRIPTION

Figure 1:
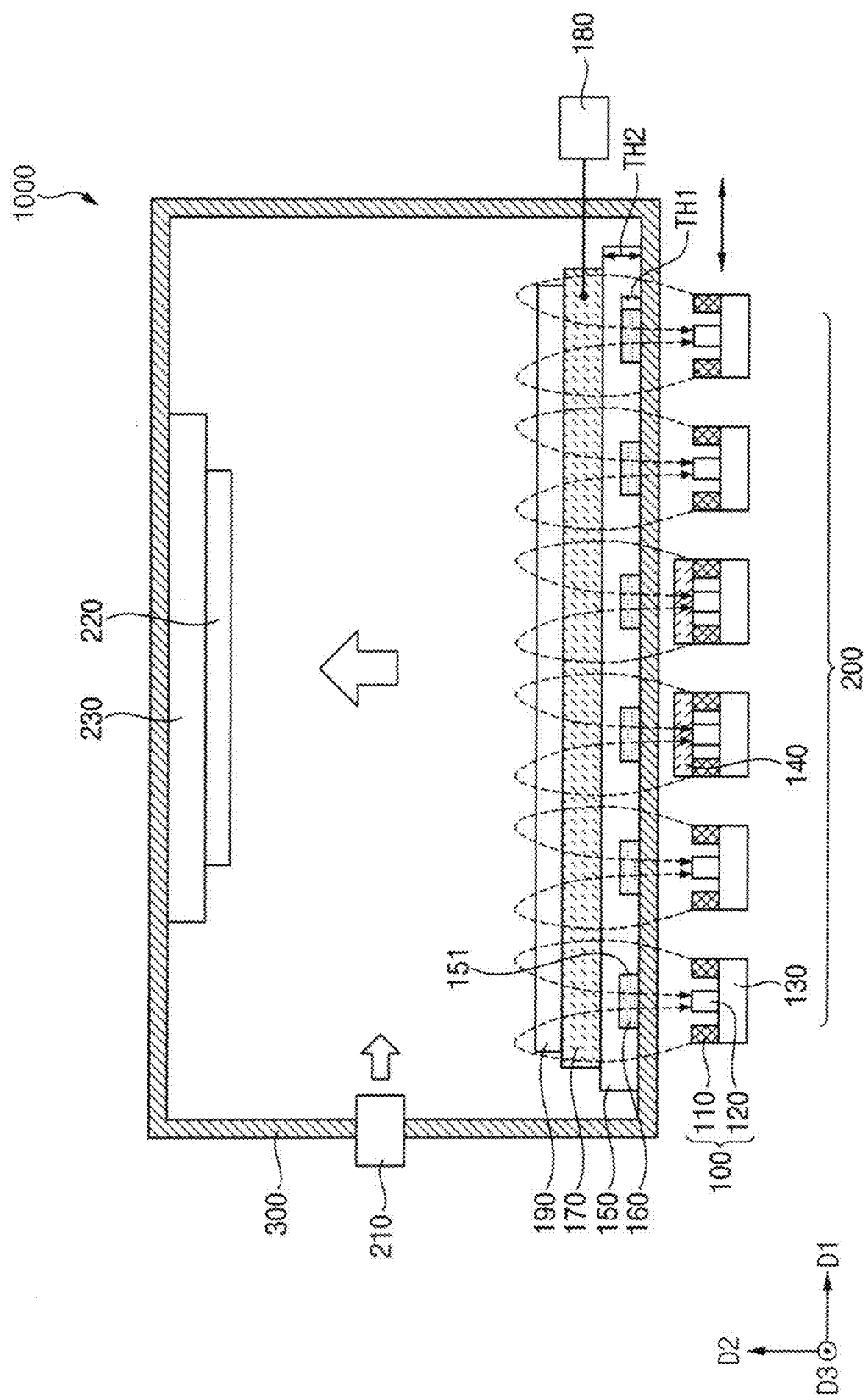
FIG. 1 is a schematic diagram illustrating an embodiment of a sputtering apparatus.

Hereinafter, embodiments of the invention will be explained in detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein. In addition, the terms such as "module," "unit" and "member", etc., may mean hardware components as understood in the art.

Figure 2:
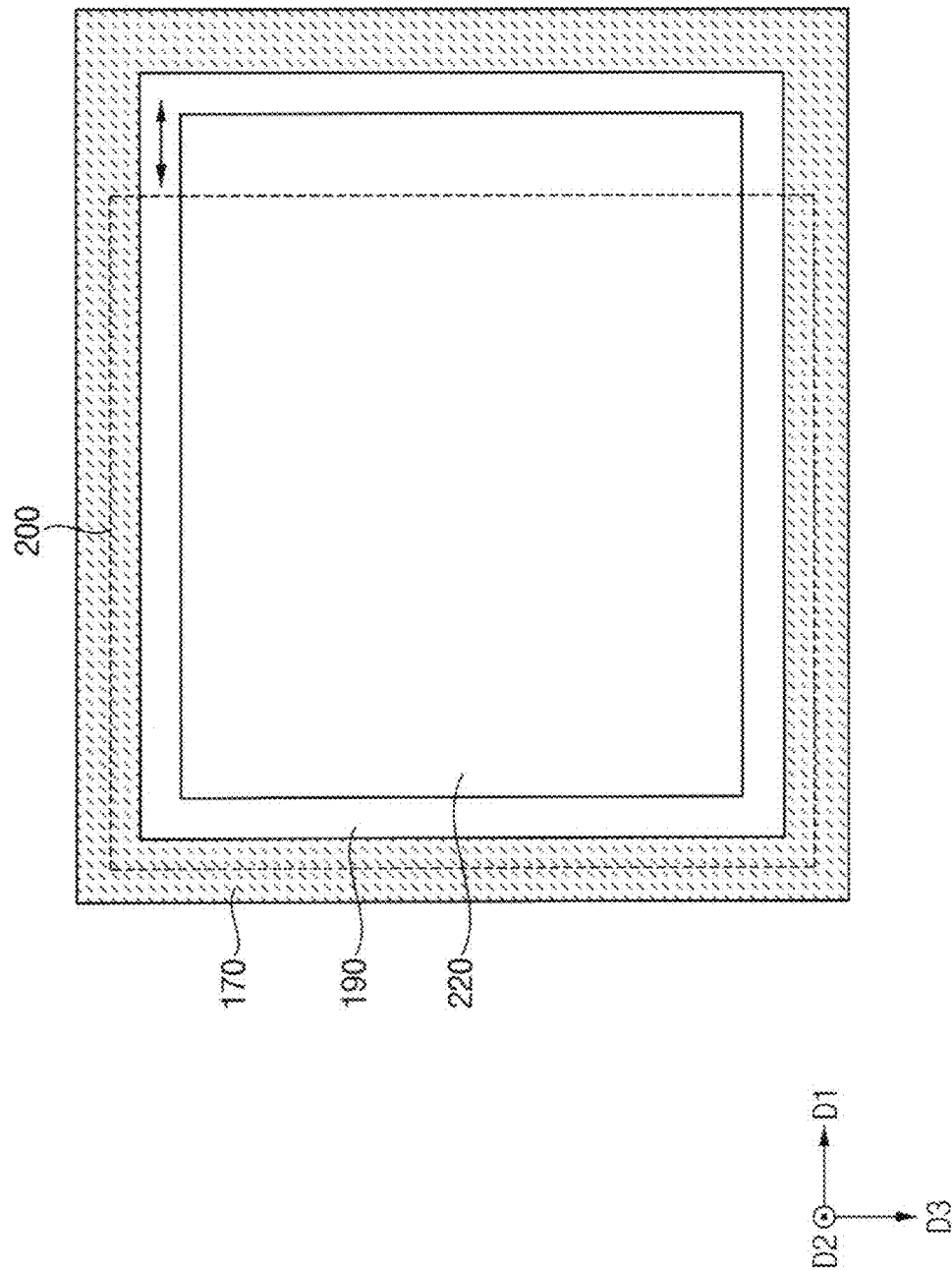
FIG. 2 is a plan view illustrating a back plate, a sputtering target, and a deposition substrate of FIG. 1.

FIG. 1 is a schematic diagram illustrating an embodiment of a sputtering apparatus. FIG. 2 is a plan view illustrating a back plate, a sputtering target, and a deposition substrate of FIG. 1.

Referring to FIGS. 1 and 2, the sputtering apparatus 1000 may include a magnet module 200, a driver 130, a first shielding member 140, a protective sheet 150, a second shielding member 160, a back plate 170, a power supply portion 180, a gas supply portion 210, a chamber 300, a substrate fixing portion 230, or the like.

The chamber 300 may include an inert gas for generating plasma and provide a discharge space. Specifically, the chamber 300 may receive the inert gas through the gas supply portion 210. In an embodiment, the inert gas may include argon (Ar), neon (Ne), or the like. These may be used alone or in combination with each other.

A deposition substrate 220 may be disposed in the chamber 300. The deposition substrate 220 may be spaced apart from a sputtering target 190 and disposed to face the sputtering target 190. The deposition substrate 220 may be fixed in the chamber 300 through the substrate fixing portion 230.

The back plate 170 may be disposed to face the deposition substrate 220. The back plate 170 may support the sputtering target 190. In addition, the back plate 170 may be electrically connected to the power supply portion 180. In an embodiment, the power supply portion 180 may provide radio-frequency ("RF") or direct-current ("DC") power to the back plate 170. In an embodiment, the back plate 170 may include copper or the like, for example.

When a voltage is applied to the back plate 170, a plasma discharge occurs inside the chamber 300, whereby the inert gas is ionized. When the ionized particles are accelerated to the sputtering target 190 and collide with the sputtering target 190, atoms constituting the sputtering target 190 may be emitted. Then, the emitted atoms may move to the deposition substrate 220, and a thin film may be formed or disposed on the deposition substrate 220.

The sputtering target 190 may include various materials depending on a thin film to be deposited. The sputtering target 190 may include a metal, a metal oxide, or the like. In an embodiment, the metal that may be used as the sputtering target 190 may include aluminum, titanium, copper, molybdenum, gold, silver, indium, zinc, tin, silicon, or the like. These may be used alone or in combination with each other. In addition, In an embodiment, the metal oxide that may include used as the sputtering target 190 may include indium oxide, zinc oxide, tin oxide, indium zinc oxide, indium tin oxide, indium zinc tin oxide, indium zinc gallium oxide, or the like. These may be used alone or in combination with each other.

The magnet module 200 may be disposed under the back plate 170. When the plasma is generated, the magnet module 200 may generate a magnetic field in the sputtering target 190 and may increase density and deposition rate of the plasma. A detailed description of the magnet module 200 will be described later.

As shown in FIG. 2, each of the back plate 170 and the sputtering target 190 may have a quadrangular (e.g., rectangular) shape in a plan view. However, the configuration of the invention is not limited thereto, and each of the back plate 170 and the sputtering target 190 may have various other shapes.

The protective sheet 150 may be disposed between the back plate 170 and the magnet module 200. In an embodiment, at least one trench 151 may be defined in the protective sheet 150. The protective sheet 150 may include an insulating material. In an embodiment, the insulating material that may be used as the protective sheet 150 may include a fluorine-based resin such as polytetrafluoroethylene ("PTFE"). A shape of the protective sheet 150 will be described later.

The magnet module 200 and the back plate 170 may be combined to constitute a cathode module. In an embodiment, an entirety of the cathode module may be disposed in the chamber 300, or the cathode module may be inserted into the chamber 300 so that only a portion of the cathode module may be disposed in the chamber 300, for example. However, the configuration of the invention is not limited thereto, and the magnet module 200 and the back plate 170 may be combined according to various known configurations.

The first shielding member 140 may be attached on the magnet unit 100. Specifically, the first shielding member 140 may be attached on a portion of the magnet unit 100. The first shielding member 140 may shield a magnetic field generated by the magnet unit 100 to reduce the magnetic field in a region where the first shielding member 140 is disposed. Accordingly, the first shielding member 140 may be disposed at a location where the magnetic field is relatively strong in the magnet module 200 to increase the uniformity of the entire magnetic field.

The first shielding member 140 may include a material having high permeability. In an embodiment, the first shielding member 140 may include stainless steel, an amorphous sheet, permalloy, a silicon steel plate, a steel plate, or the like, for example. These may be used alone or in combination with each other.

The at least one second shielding member 160 may be disposed between the back plate 170 and the magnet module 200. The second shielding member 160 may have a fixed position. Specifically, the second shielding member 160 may be inserted into the trench 151 and may be fixed to the protective sheet 150. The second shielding member 160 may shield the magnetic field generated by the magnet unit 100 to reduce the magnetic field in a region where the second shielding member 160 is disposed. A detailed description of the second shielding member 160 will be described later.

In an embodiment, a thickness Th1 of the second shielding member 160 may be smaller than a thickness Th2 of the protective sheet 150 in the second direction D2. In an alternative embodiment, the thickness of the second shielding member 160 may be equal to the thickness of the protective sheet 150 in the second direction D2.

The second shielding member 160 may include a metal. In an embodiment, the second shielding member 160 may include stainless steel, an amorphous sheet, permalloy, a silicon steel plate, pure iron, or the like, for example. These may be used alone or in combination with each other. In an embodiment, the second shielding member 160 may include a mixed material including stainless steel, permalloy, and pure iron.

Figure 3:
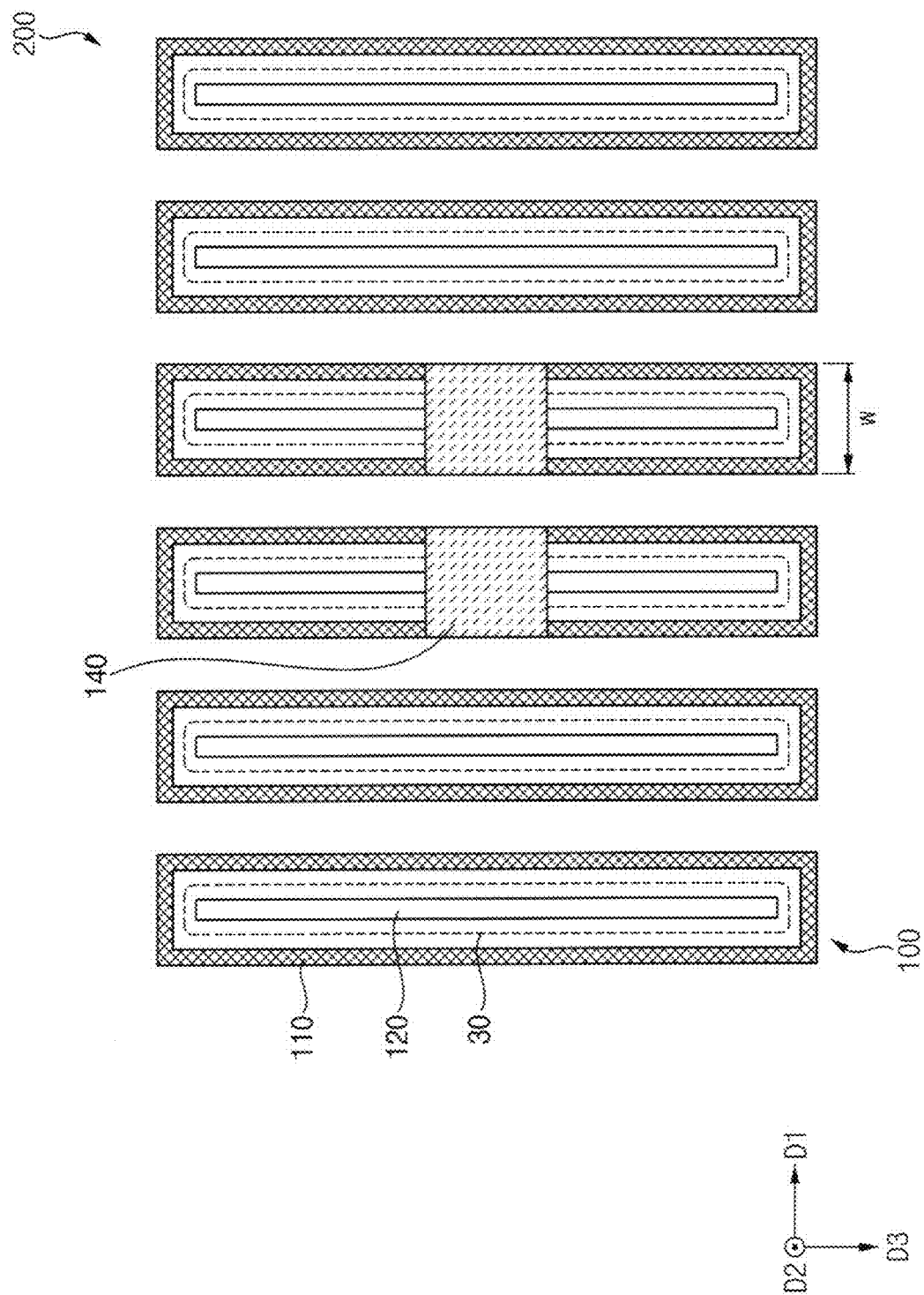
FIG. 3 is a plan view illustrating a magnet module and a first shielding member of FIG. 1.

FIG. 3 is a plan view illustrating a magnet module and a first shielding member of FIG. 1.

Referring to FIGS. 1 and 3, the magnet module 200 may include at least one magnet unit 100. The at least one magnet unit 100 may be arranged along a first direction D1.

The magnet unit 100 may include a first magnet member 110 and a second magnet member 120. In an embodiment, the first magnet member 110 may have a shape surrounding the second magnet member 120, and the second magnet member 120 may extend in a straight line along the third direction D3 in a plan view.

The first magnet member 110 and the second magnet member 120 may have opposite poles. In an embodiment, the first magnet member 110 may be an N-pole magnet, and the second magnet member 120 may be an S-pole magnet, for example. In an alternative embodiment, the first magnet member 110 may be an S-pole magnet, and the second magnet member 120 may be an N-pole magnet.

In an embodiment, the magnet unit 100 may reciprocate in a horizontal direction (e.g., the first direction D1). Specifically, the magnet unit 100 may reciprocate in the horizontal direction through the driver 130 to apply a magnetic field to the sputtering target 190 in a scan method.

One plasma race track 30 may be formed or disposed on a surface of the sputtering target 190 due to the one magnet unit 100. Specifically, the plasma race track 30 may be generated between the first magnet member 110 and the second magnet member 120. The plasma race track 30 may be defined as connecting points where a vertical component of the magnetic field generated by the magnet unit 100 becomes "0".

The first shielding member 140 may move together with the magnet unit 100. That is, the first shielding member 140 may be attached to the magnet unit 100 and may reciprocate along with the magnet unit 100 in the horizontal direction.

In an embodiment, the first shielding member 140 may cover at least a portion of the magnet unit 100. In an embodiment, the first shielding member 140 may selectively cover a central portion of the magnet unit 100 disposed in an inner region, for example. However, the configuration of the invention is not limited thereto, and the first shielding member 140 may be disposed in various ways in consideration of the magnetic field distribution of the magnet module 100.

Figure 4:
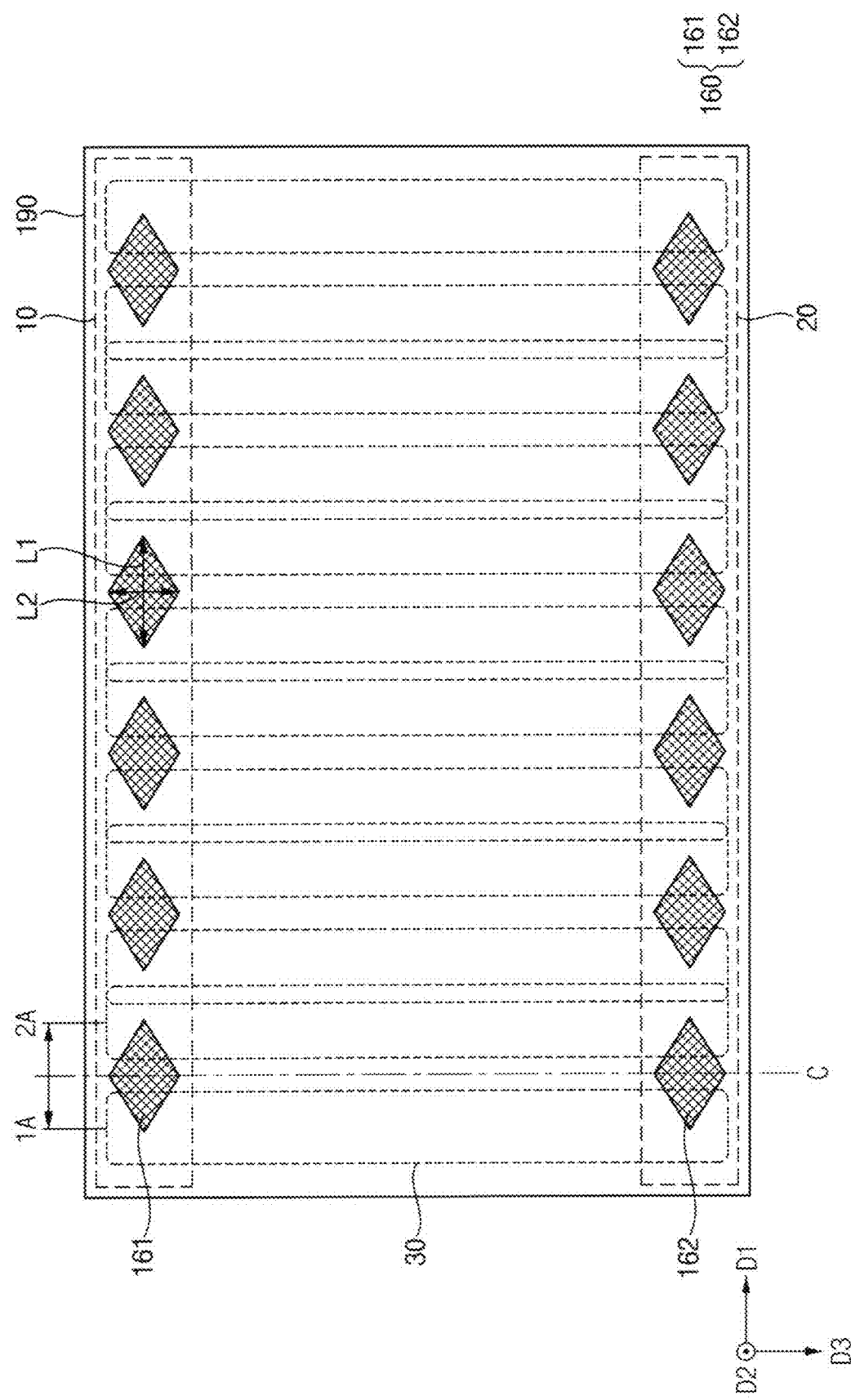
FIG. 4 is a plan view illustrating an embodiment of a second shielding member of FIG. 1.
Figure 5:
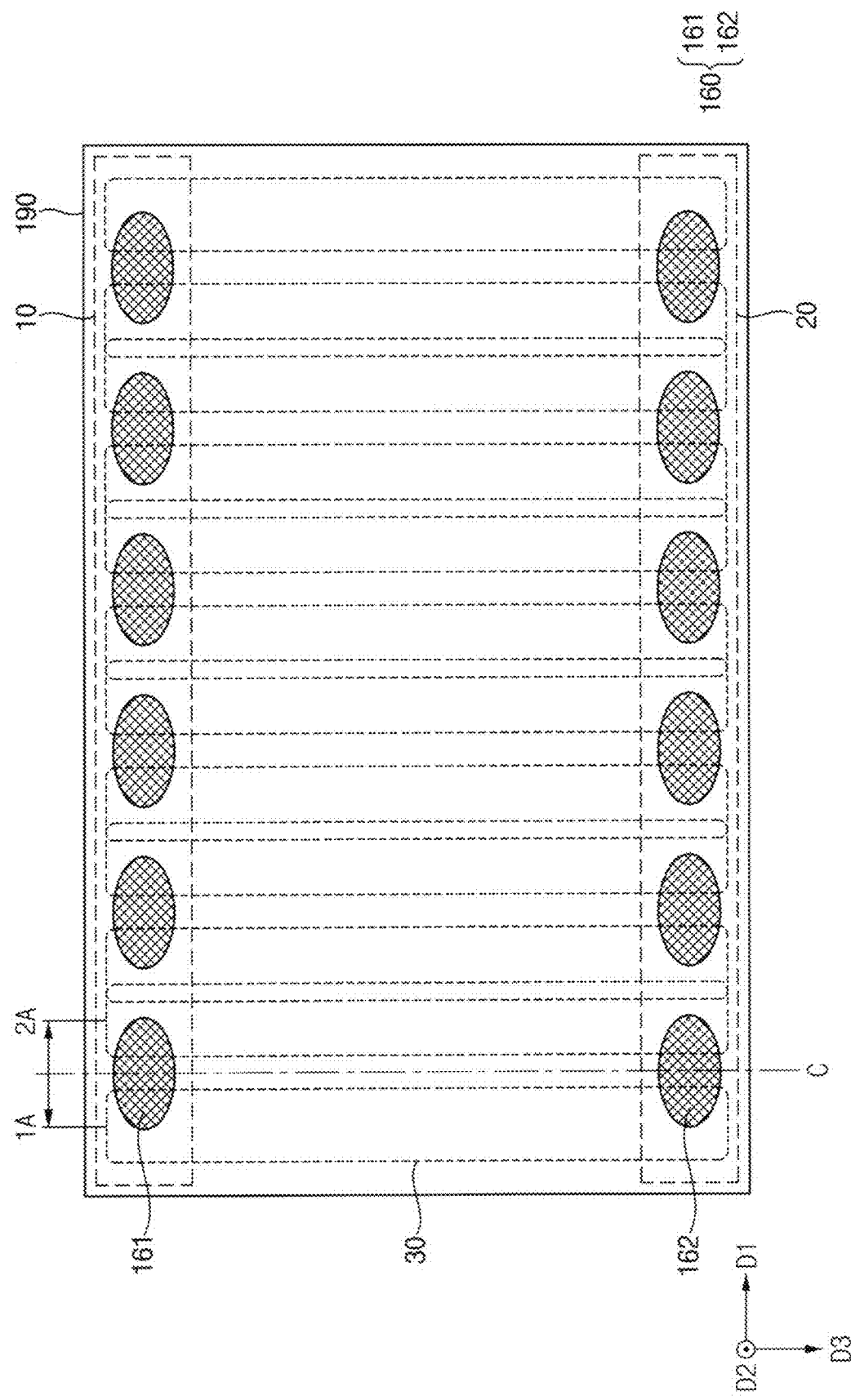
FIG. 5 is a plan view illustrating another embodiment of a second shielding member of FIG. 1.
Figure 6:
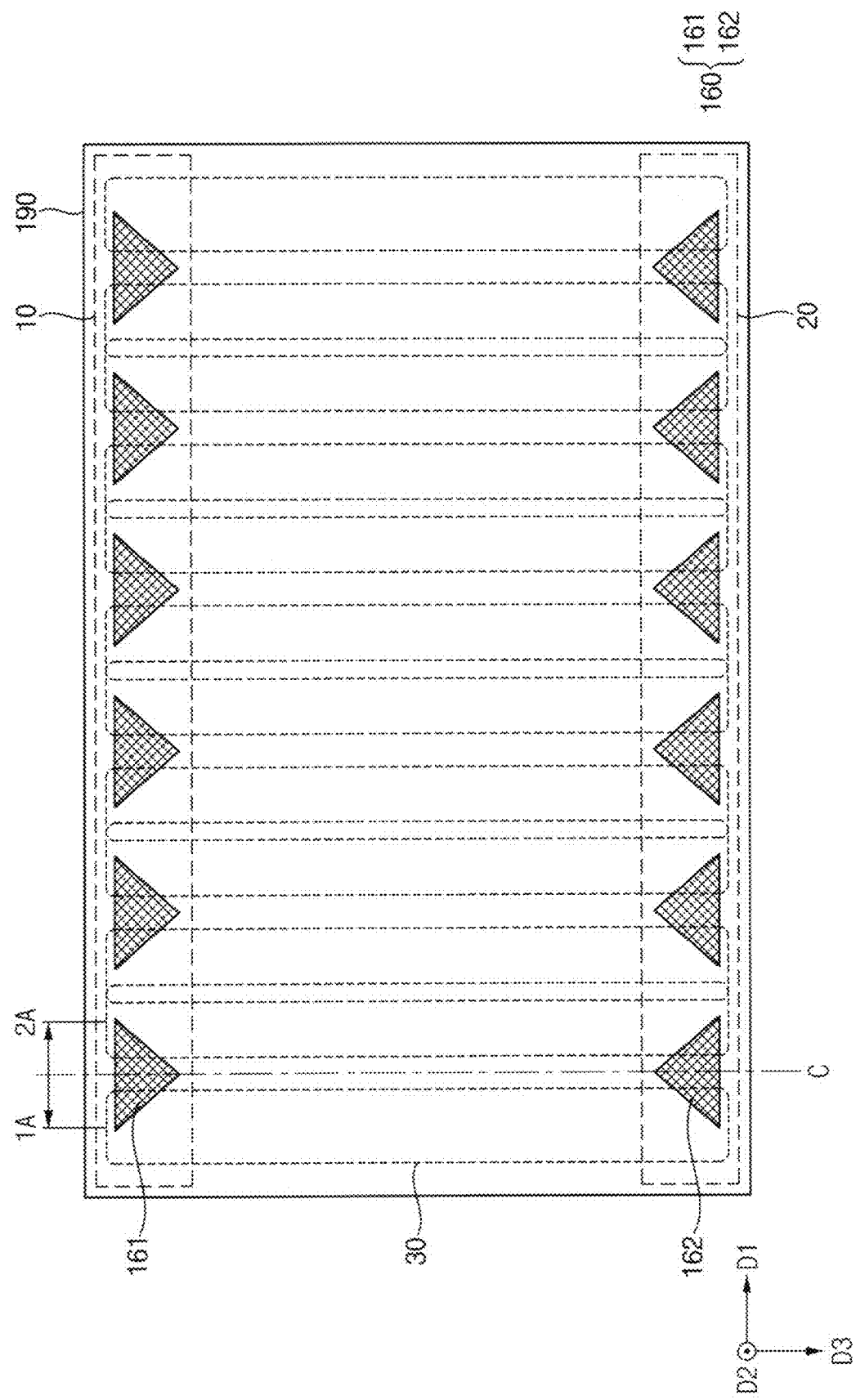
FIG. 6 is a plan view illustrating still another embodiment of a second shielding member of FIG. 1.

FIG. 4 is a plan view illustrating an embodiment of a second shielding member of FIG. 1. FIG. 5 is a plan view illustrating another embodiment of a second shielding member of FIG. 1. FIG. 6 is a plan view illustrating still another embodiment of a second shielding member of FIG. 1. FIGS. 4, 5, and 6 show the second shielding member 160 and sputtering target 190 of FIG. 1 and the plasma race track 30 of FIG. 3, for example.

Referring to FIGS. 4, 5 and 6, in an embodiment, the second shielding member 160 may have a polygonal shape in a plan view.

As shown in FIG. 4, the second shielding member 160 may have a rhombus shape. As shown in FIG. 5, the second shielding member 160 may have an elliptical shape. As shown in FIG. 6, the second shielding member 160 may have an inverted triangle shape. However, the configuration of the invention is not limited thereto, and the second shielding member 160 may have various other polygonal shapes in a plan view.

As described above, the magnet unit 100 may reciprocate in the horizontal direction. Specifically, the one magnet unit 100 may reciprocate between a first point 1A and a second point 2A of the sputtering target 190. When the magnet unit 100 reciprocates between the first point 1A and the second point 2A, the plasma race track 30 is formed or disposed at each of the first point 1A and the second point 2A. Here, the first point 1A may be a point when the one magnet unit 100 moves to a left end and the second point 2A may be a point when one magnet unit 100 moves to a right end.

In an embodiment, a center point of the second shielding member 160 may coincide with a center line C between the first point 1A and the second point 2A of the sputtering target 190. Accordingly, a non-uniformity distribution of the entire magnetic field generated by the magnet unit 100 may be improved. Accordingly, an erosion non-uniformity of the sputtering target 190 may be improved.

In an embodiment, the one second shielding member 160 has a first shielding pattern 161 overlapping a first end portion 10 of the sputtering target 190 and a second shielding pattern 162 overlapping a second end portion 20 of the sputtering target 190. Each of the first end portion 10 and the second end portion 20 may have a length extending in the first direction D1. In an embodiment, the length of the first end portion 10 and the length of the second end portion 20 may be equal to each other, for example.

The second shielding pattern 162 may be spaced apart from the first shielding pattern 161 in a vertical direction (e.g., a third direction D3) orthogonal to the horizontal direction. In addition, each of the at least one first shielding pattern 161 and the at least one second shielding pattern 162 may be arranged along the first direction D1.

In an embodiment, the number of the first shielding pattern 161 and the number of the second shielding pattern 162 may be the same. In an embodiment, the number of each of the first shielding pattern 161 and the second shielding pattern 162 may be six, for example.

In an embodiment, the number of the first shielding pattern 161 or the number of the second shielding pattern 162 may be the same as the number of the magnet unit 100. In an embodiment, when the number of the magnet unit 100 is six, the number of each of the first shielding pattern 161 and the second shielding pattern 162 may be six, for example.

In an embodiment, a first length L1 of the second shielding member 160 (e.g., first shielding pattern 161 in FIG. 4) in a first direction D1 is about 0.6 to about 1.2 of a width w (refer to FIG. 3) of the magnet unit 100 in the first direction D1, and a second length L2 of the second shielding member 160 in a third direction D3 orthogonal to the first direction D1 is about 0.5 to about 1 of the first length L1 in a plan view, for example.

Figure 7:
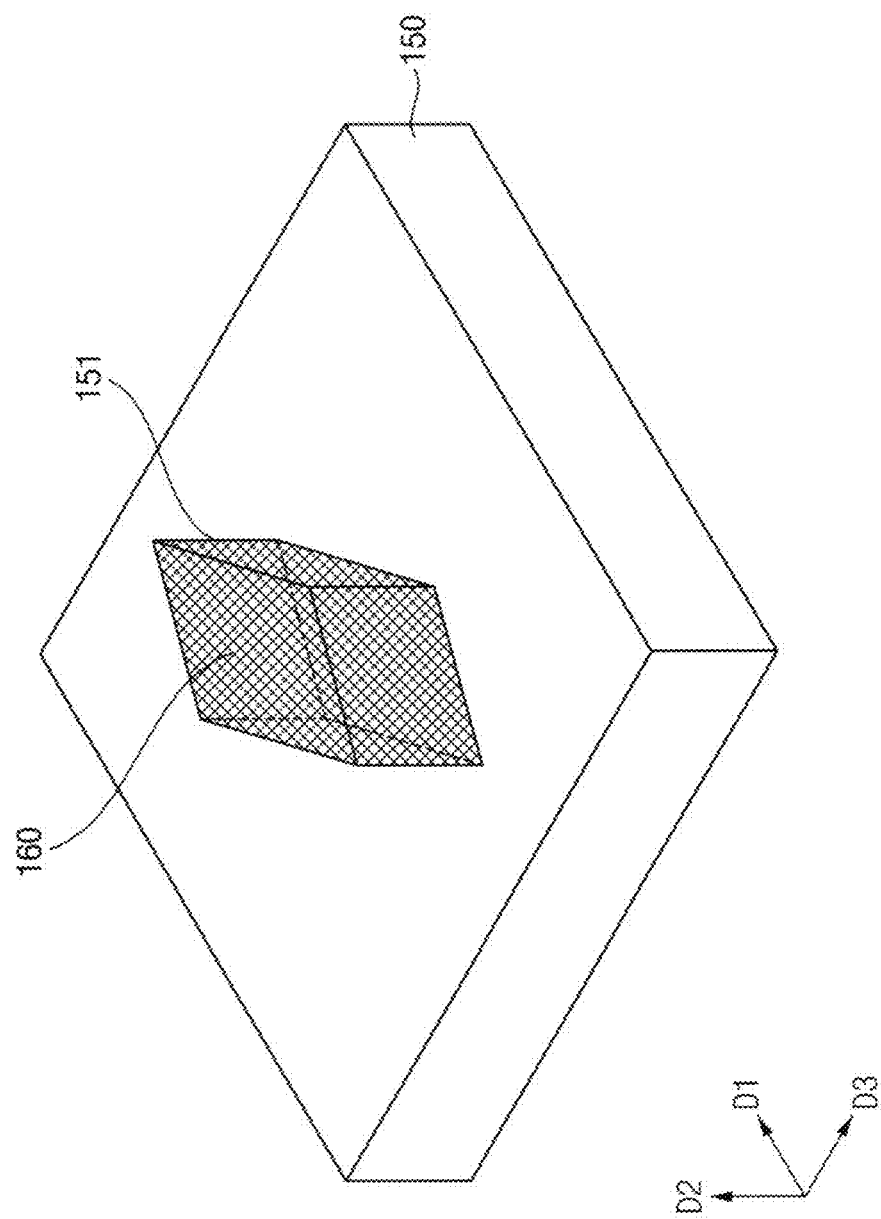
FIG. 7 is a perspective view illustrating a protective sheet and a second shielding member of FIG. 1.

FIG. 7 is a perspective view illustrating a protective sheet and a second shielding member of FIG. 1. FIG. 8 is a perspective view illustrating another embodiment of a protective sheet and a second shielding member of a sputtering apparatus.

Referring to FIGS. 1 and 7, as described above, at least one trench 151 may be defined in the protective sheet 150. The one second shielding member 160 may be inserted into one trench 151. That is, the second shielding member 160 may be inserted into the trench 151 and fixed to the protective sheet 150. Accordingly, the second shielding member 160 may have a fixed position.

Referring to FIG. 8, in an embodiment, a plurality of block grooves 152 may be defined in the protective sheet 150, and the second shielding member 160 may include a plurality of block bodies 165. The block bodies 165 may be inserted into at least some of the block grooves 152. Accordingly, a shape of the second shielding member 160 may be modified according to the number of block bodies 165 inserted into the block grooves 152.

In an embodiment, when the second shielding member 160 does not sufficiently shield the magnetic field generated by the magnet unit (e.g., the magnet unit 100 shown in FIG. 1), the shape of the second shielding member may be modified by adjusting the number of block bodies 165, for example. Accordingly, a non-uniformity of the entire magnetic field may be improved more effectively.

In a sputtering apparatus, in order to improve a non-uniformity of a total magnetic field generated by a magnet unit, a shielding member for shielding the magnetic field is attached on the magnet unit. However, a uniformity of the magnetic field cannot be effectively increased with the shielding member. Thereby, an erosion non-uniformity of a sputtering target occurs.

The sputtering apparatus 1000 in an embodiment may include the first shielding member 140 attached to at least a portion of the magnet unit 100, and the second shielding member 160 disposed between the first shielding member 140 and the back plate 170 and having the fixed position. Accordingly, the erosion non-uniformity of the sputtering target 190 may be improved. In this case, a lifetime of the sputtering target 190 may be extended.

Embodiments of the invention may be applied to manufacturing various display devise that may include a display device. In an embodiment, the invention may be applied to manufacturing high-resolution smartphones, mobile phones, smart pads, smart watches, tablet personal computers ("PCs"), in-vehicle navigation systems, televisions, computer monitors, notebook computers, or the like, for example.

The foregoing is illustrative of embodiments and is not to be construed as limiting thereof. Although the embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A sputtering apparatus comprising:
a back plate supporting a sputtering target;
a magnet module disposed under the back plate and including a magnet unit reciprocating in a first direction;
a first shielding member attached on a portion of the magnet unit, moving together with the magnet unit, and covering at least a portion of the magnet unit;
a protective sheet disposed between the back plate and the magnet module; and
a second shielding member disposed between the back plate and the magnet module, and having a fixed position,
wherein the protective sheet is in contact with the second shielding member, the first shielding member is disposed between the magnet module and the second shielding member, and
wherein the second shielding member overlaps an end of the sputtering target having a length extending in the first direction.

2. The sputtering apparatus of claim 1, wherein the magnet unit reciprocates between a first point and a second point of the sputtering target, and a center point of the second shielding member coincides with a center line between the first point and the second point.

3. The sputtering apparatus of claim 1, wherein a trench is defined in the protective sheet and the second shielding member is inserted into the trench.

4. The sputtering apparatus of claim 1, wherein the second shielding member includes a metal.

5. The sputtering apparatus of claim 4, wherein the second shielding member includes at least one of stainless steel, permalloy, and pure iron.

6. The sputtering apparatus of claim 1, wherein the first shielding member includes stainless steel.

7. The sputtering apparatus of claim 1, wherein the protective sheet includes polytetrafluoroethylene.

8. The sputtering apparatus of claim 1, wherein a thickness of the second shielding member is smaller than a thickness of the protective sheet in a thickness direction orthogonal to a main plane extension direction of the second shielding member.

9. The sputtering apparatus of claim 1, wherein the second shielding member has a polygonal shape in a plan view.

10. The sputtering apparatus of claim 9, wherein the polygonal shape is at least one of a rhombus shape, a circle shape, an ellipse shape, and an inverted triangle shape.

11. The sputtering apparatus of claim 1, wherein the second shielding member includes:
a first shielding pattern overlapping a first end of the sputtering target; and
a second shielding pattern spaced apart from the first shielding pattern in a second direction intersecting the first direction and overlapping a second end of the sputtering target.

12. The sputtering apparatus of claim 11, wherein a number of the first shielding pattern is equal to a number of the second shielding pattern.

13. The sputtering apparatus of claim 12, wherein the number of the first shielding pattern or the number of the second shielding pattern is equal to a number of the magnet unit.

14. The sputtering apparatus of claim 1, wherein a first length of the second shielding member in the first direction is about 0.6 to about 1.2 of a width of the magnet unit in the first direction, and a second length of the second shielding member in a second direction intersecting the first direction is about 0.5 to about 1 of the first length in a plan view.

15. The sputtering apparatus of claim 1, wherein the magnet unit includes:
a first magnet member extending in a linear shape in a plan view; and
a second magnet member having a shape surrounding the first magnet member in the plan view.

* * * * *